(12) United States Patent
Huard

(10) Patent No.: US 7,092,475 B1
(45) Date of Patent: Aug. 15, 2006

(54) PHASE-FREQUENCY DETECTOR WITH LINEAR PHASE ERROR GAIN NEAR AND DURING PHASE-LOCK IN DELTA SIGMA PHASE-LOCKED LOOP

(75) Inventor: Jeffrey Mark Huard, Puyallup, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 787 days.

(21) Appl. No.: 10/254,208

(22) Filed: Sep. 25, 2002

(51) Int. Cl.
*H03D 3/24* (2006.01)
(52) U.S. Cl. .................. 375/375; 375/376; 327/156
(58) Field of Classification Search ............. 375/371, 375/375, 373, 376, 327; 327/141, 146, 147, 327/150, 155, 156, 159, 7, 161
See application file for complete search history.

(56) References Cited

U.S. PATENT DOCUMENTS

| | | | | |
|---|---|---|---|---|
| 5,315,269 | A * | 5/1994 | Fujii ........................ | 331/1 A |
| 5,764,709 | A * | 6/1998 | Whiteside ................. | 375/375 |
| 5,877,658 | A * | 3/1999 | Baba ........................ | 331/18 |
| 6,147,561 | A * | 11/2000 | Rhee et al. ............... | 331/12 |
| 6,218,868 | B1 * | 4/2001 | Katoh ....................... | 327/12 |
| 6,834,085 | B1 * | 12/2004 | Leonowich et al. ...... | 375/316 |
| 2002/0118053 | A1 * | 8/2002 | Sumi et al. ............... | 327/157 |

OTHER PUBLICATIONS

Bitting et al., A 30-128 MHz Frequency Synthesizer Standard Cell, Proc. CICC, pp. 24.1.1-24.1.6 (pp. 355-360), May 1992.
Best, Roland E., "Phase Locked Loops", 1997, pp. 91-102, 3$^{rd}$ ed., McGraw-Hill, United States.

* cited by examiner

*Primary Examiner*—Chieh M. Fan
*Assistant Examiner*—Naheed Ejaz
(74) *Attorney, Agent, or Firm*—Vedder Price Kaufman & Kammholz, P.C.

(57) ABSTRACT

A phase-frequency detector (PFD) having substantially linear phase error gain within a predetermined phase error range centered about zero phase error when used in a delta sigma phase-locked loop (PLL). The output signals (e.g., charge pump control signals), which are also used to reset the input circuitry, are fed back with asymmetrical signal delays, thereby causing one of the output signals to remain in an asserted state for a substantially constant time duration at least during when a difference between the reference and feedback signal phases is within a predetermined phase difference range centered about zero phase difference.

14 Claims, 5 Drawing Sheets

PHASE-FREQUENCY DETECTOR WITH LINEAR PHASE ERROR GAIN NEAR AND DURING PHASE-LOCK IN DELTA SIGMA PHASE-LOCKED LOOP

BACKGROUND OF THE INVENTION

1. Field of Invention

The present invention relates to digital phase-locked loops (PLLs), and in particular, to phase-frequency detectors (PFD) used in delta sigma PLLs.

2. Description of the Related Art

Referring to FIG. 1, a conventional PFD 10 that has been used in many digital PLL designs (including delta sigma PLLs) includes two D-type flip-flops 12u, 12d, an AND gate 14 and a delay circuit 16, all interconnected substantially as shown. The flip-flops 12u, 12d are separately clocked by the reference signal R and feedback divisor signal N. With each rising edge of these input signals R, N, a logic one (VDD applied at the D-inputs) is clocked through to the output Q of each flip-flop 12U, 12D. The data output signals Q of the flip-flops 12U, 12D form the "pump up" UP and "pump down" DN signals used for controlling a charge pump circuit 20 in accordance with well known principles.

Whenever the reference signal R is asserted, the pump up signal UP is also asserted. Similarly, whenever the feedback signal N is asserted, the pump down signal DN is also asserted. When the pump up signal UP is asserted (and inverted by the inverter 18 within the charge pump 20), the output pull-up transistor P1 is turned on, thereby causing electrical charge to be sourced to, or "pumped" into, the output terminal 21. Conversely, when the pump down signal DN is asserted, the output pull down transistor N1 is turned on, thereby causing an electrical charge to be sunk from, or "pumped" out of, the output terminal 21. The logic AND gate 14 ensures that the data output signals Q of the flip-flops 12u, 12d are cleared following assertion of both signals UP, DN simultaneously. The delay circuit 16 (various types of which are well known in the art) delays the logical AND signal 15 so as to assert the clear, or reset, signal 17 at a predetermined point in time following simultaneous assertion of both signals UP, DN and thereby allow for proper signal set-up times and avoidance of signal race conditions, as well as ensure an adequate output pulse width to minimize crossover distortion (discussed in more detail below).

This type of PFD 10 is widely used due to the advantages afforded by its transfer function. As is well known, this type of PFD 10 has a transfer function such that the output signal 23 of the charge pump 20, due to the control signals UP, DN provided by the PFD 10, depends upon the phase difference between the two input signals R, N when the host PLL is in its phase-locked state, and depends upon the frequency difference between the input signals R, N when the host PLL is in its unlocked state. Accordingly, a digital PLL in which this PFD 10 is used will lock under any condition, in terms of the input signals R, N, regardless of the type of loop filter in use.

Referring to FIG. 2, most loop filters 22 have low pass frequency characteristics and typically consist of a serially-connected resistor R and capacitor C1 connected in shunt with another capacitor C2, as shown. In this type of second order loop filter, the series capacitor C1 generally has a larger capacitance value then the shunt capacitor C2.

Referring to FIG. 3, the transfer function, in terms of the filtered charge pump output signal/PFD_out/23a versus the input phase error θerr (i.e., the difference in phase between the two input signals R, N), can be represented as shown. Ideally, the gain of the PFD 10 is linear over the full range of $-2\pi$ to $+2\pi$ radians of phase error θerr including the region centered about zero phase error during which the host PLL is phase-locked. When the phase error θerr becomes greater then $2\pi$ radians, the output signal/PFD_out/23a begins to wrap and becomes proportional to the phase error θerr in a pattern that repeats every $2\pi$ radians. (This characteristic is that demonstrated by the average of the actual pump up UP and pump down DN control signals generated by the PFD circuit 10.)

Referring to FIG. 4, there are three basic conditions under which a PFD circuit, such as that 10 shown in FIG. 1 operates: during phase-lock, i.e., when the reference and feedback signal frequencies are equal; when the feedback signal frequency is greater then the reference signal frequency; and when the feedback signal frequency is less then the reference signal frequency. When the feedback and reference signal frequencies are equal (time interval T1), the reference R and feedback N signal pulses are in alignment, as are the pump up UP and pump down DN signals. As a result, the net output 23 from the charge pump 20 is zero. When the feedback signal frequency is greater than the reference signal frequency (time interval T2), the feedback signal N pulses lead those of the reference signal R, as do the signal pulses of the pump down signal DN as compared to the pump up signal UP. As a result, the net output 23 from the charge pump 20 is negative, i.e., a sinking of current, or charge, from the output terminal 21 (FIG. 1). Conversely, when the feedback signal frequency is less then the reference signal frequency (time interval T3), the reference signal R pulses lead those of the feedback signal N, as do the signal pulses of the pump up signal UP as compared to the pump down signal DN. As a result, the net output 23 of the charge pump 20 is positive, i.e., a sourcing of current, or charge, to the output terminal 21. (As should be understood, the foregoing discussion applies to a PLL in which the voltage controlled oscillator (VCO) 24 (FIG. 2) has a positive gain characteristic Kvco; for a VCO with a negative gain characteristic Kvco, the charge pump current pulses would be inverted.)

Referring to FIG. 5, as noted above, the transfer function of the PFD 10 is ideally linear through and about the region R centered at zero phase error, i.e., near and during phase-lock. As is well known in the art, phase detectors and PFDs are susceptible to crossover distortion (often referred to as a "dead zone") within the region D of near-zero phase difference between the two input signals R, N. In this region D, the small signal gain is near zero and can have dramatic changes for very small input phase errors, thereby introducing frequency jitter in the output of the host PLL. When this small signal gain is so low, often approaching zero, the feedback loop is essentially broken and electrical charge will leak off the high impendence output node 21 of the charge pump 20 (FIG. 1) until the phase difference between the input signals R, N becomes sufficiently large for the phase detector to exit this dead zone D and turn the charge pump 20 back on to correct such phase error. (This happens as a result of the signal pulses of the reference R and feedback N signals becoming so close together near and at phase-lock that the PFD is unable to distinguish them.) As is also well known in the art, and as noted above, delay in the feedback circuit, e.g., via delay circuit 16 (FIG. 1), is introduced to ensure an adequate output pulse width to minimize the dead zone D. As shown in FIG. 5, once the dead zone D has been minimized, the linearity of the transfer function of the PFD 10 is limited by the mismatch between the pump up current (sourced by transistor P1 to the output terminal 21) and pump down current (sunk by transistor N1 from the output terminal 21) of the charge pump 20. The effect of such current mismatch is represented by the difference in the slopes of the transfer function of the PFD 10 in the regions above and below the horizontal axis. Mismatch between the charge pump currents (pump up and pump down) is a particularly significant problem for delta sigma PLLs due to problems associated with maintaining matched pump up and pump down currents provided by the charge pump 20 to the output terminal 21 (FIG. 1). Particularly with such currents typically being quite small, and with ever decreasing transistor dimensions, matching such small currents is virtually impossible, particularly over variations in operating conditions (e.g., power supply voltages and circuit operating temperature) and fabrication processes. As is well known, charge pump current mismatch is a significant problem for delta sigma PLLs because they intentionally introduce large phase errors (positive or negative) to the phase detectors (i.e., multiple VCO pulse periods of error), and it is important that the loop gain remain linear to avoid mixing the high energy, high frequency spurious offset signals down to lower frequencies where the loop filter can no longer adequately suppress them. Hence, the performance of a delta sigma PLL is often a function of how well the linearity of the combined PFD and charge pump circuitry can be maintained.

Accordingly, it would be desirable to have a PFD with substantially linear phase error gain within the phase error range centered about zero phase error, i.e., near and during phase-lock, without requiring precision matching of charge pump output currents.

SUMMARY OF THE INVENTION

In accordance with the presently claimed invention, a phase-frequency detector (PFD) is provided with substantially linear phase error gain within a predetermined phase error range centered about zero phase error when used in a delta sigma phase-locked loop (PLL). The output signals (e.g., charge pump control signals), which are also used to reset the input circuitry, are fed back with asymmetrical signal delays, thereby causing one of the output signals to remain in an asserted state for a substantially constant time duration at least during when a difference between the reference and feedback signal phases is within a predetermined phase difference range centered about zero phase difference.

In accordance with one embodiment of the presently claimed invention, a phase-frequency detector (PFD) having substantially linear phase error gain within a predetermined phase error range centered about zero phase error when used in a delta sigma phase-locked loop (PLL) includes first and second logic circuitry. The first logic circuitry receives reference, feedback and output control signals and in response thereto provides frequency increase and decrease control signals, wherein: the reference signal has an associated frequency, phase and assertion state; the feedback signal has an associated frequency, phase and assertion state; the frequency increase control signal is indicative of when the feedback signal frequency is lower than the reference signal frequency, has an assertion state corresponding to the reference signal assertion state and has a de-assertion state responsive to the output control signal; and the frequency decrease control signal is indicative of when the feedback signal frequency is higher than the reference signal frequency, has an assertion state corresponding to the feedback signal assertion state and has a de-assertion state responsive to the output control signal. The second logic circuitry, coupled to the first logic circuitry, receives and combines the frequency increase and decrease control signals and in response thereto provides the output control signal, wherein one of the frequency increase and decrease control signal assertion states is of a substantially constant time duration at least during when a difference between the reference and feedback signal phases is within a predetermined phase difference range centered about zero phase difference.

In accordance with another embodiment of the presently claimed invention, a phase-frequency detector (PFD) having substantially linear phase error gain within a predetermined phase error range centered about zero phase error when used in a delta sigma phase-locked loop (PLL) includes first, second and third logic circuitry. The first logic circuitry receives a reference signal and an output control signal and in response thereto provides a frequency increase control signal and a corresponding delayed frequency increase control signal. The second logic circuitry receives a feedback signal and the output control signal and in response thereto provides a frequency decrease control signal and a corresponding delayed frequency decrease control signal. The third logic circuitry, coupled to the first logic circuitry and the second logic circuitry, receives and combines the delayed frequency increase and decrease control signals and in response thereto provides the output control signal. The reference signal has an associated frequency, phase and assertion state. The feedback signal has an associated frequency, phase and assertion state. The frequency increase control signal is indicative of when the feedback signal frequency is lower than the reference signal frequency, has an assertion state corresponding to the reference signal assertion state and has a de-assertion state responsive to the output control signal. The frequency decrease control signal is indicative of when the feedback signal frequency is higher than the reference signal frequency, has an assertion state corresponding to the feedback signal assertion state and has a de-assertion state responsive to the output control signal. The delayed frequency increase and decrease control signals are delayed by substantially unequal time intervals. One of the frequency increase and decrease control signal assertion states is of a substantially constant time duration at least during when a difference between the reference and feedback signal phases is within a predetermined phase difference range centered about zero phase difference.

In accordance with still another embodiment of the presently claimed invention, a phase-frequency detector (PFD) having substantially linear phase error gain within a predetermined phase error range centered about zero phase error when used in a delta sigma phase-locked loop (PLL) includes first and second logic means. The first logic means is for receiving reference, feedback and output control signals and in response thereto providing frequency increase and decrease control signals, wherein: the reference signal has an associated frequency, phase and assertion state; the feedback signal has an associated frequency, phase and assertion state; the frequency increase control signal is indicative of when the feedback signal frequency is lower than the reference signal frequency, has an assertion state corresponding to the reference signal assertion state and has a de-assertion state responsive to the output control signal; and the frequency decrease control signal is indicative of when the feedback signal frequency is higher than the reference signal frequency, has an assertion state corresponding to the feedback signal assertion state and has a de-assertion state responsive to the output control signal. The second logic means is for combining the frequency increase and decrease control signals and in response thereto providing the output control signal, wherein one of the frequency increase and decrease control signal assertion states is of a substantially constant time duration at least during when a difference between the reference and feedback signal phases is within a predetermined phase difference range centered about zero phase difference.

In accordance with yet another embodiment of the presently claimed invention, a phase-frequency detector (PFD) having substantially linear phase error gain within a predetermined phase error range centered about zero phase error when used in a delta sigma phase-locked loop (PLL) includes first, second and third logic means. The first logic means is for receiving a reference signal and an output control signal and in response thereto providing a frequency increase control signal and a corresponding delayed frequency increase control signal. The second logic means is for receiving a feedback signal and the output control signal and in response thereto providing a frequency decrease control signal and a corresponding delayed frequency decrease control signal. The third logic means is for combining the delayed frequency increase and decrease control signals and in response thereto providing the output control signal. The reference signal has an associated frequency, phase and assertion state. The feedback signal has an associated frequency, phase and assertion state. The frequency increase control signal is indicative of when the feedback signal frequency is lower than the reference signal frequency, has an assertion state corresponding to the reference signal assertion state and has a de-assertion state responsive to the output control signal. The frequency decrease control signal is indicative of when the feedback signal frequency is higher than the reference signal frequency, has an assertion state corresponding to the feedback signal assertion state and has a de-assertion state responsive to the output control signal. The delayed frequency increase and decrease control signals are delayed by substantially unequal time intervals. One of the frequency increase and decrease control signal assertion states is of a substantially constant time duration at least during when a difference between the reference and feedback signal phases is within a predetermined phase difference range centered about zero phase difference.

BRIEF DESCRIPTIONS OF THE DRAWINGS

DETAIL DESCRIPTION OF THE INVENTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1:
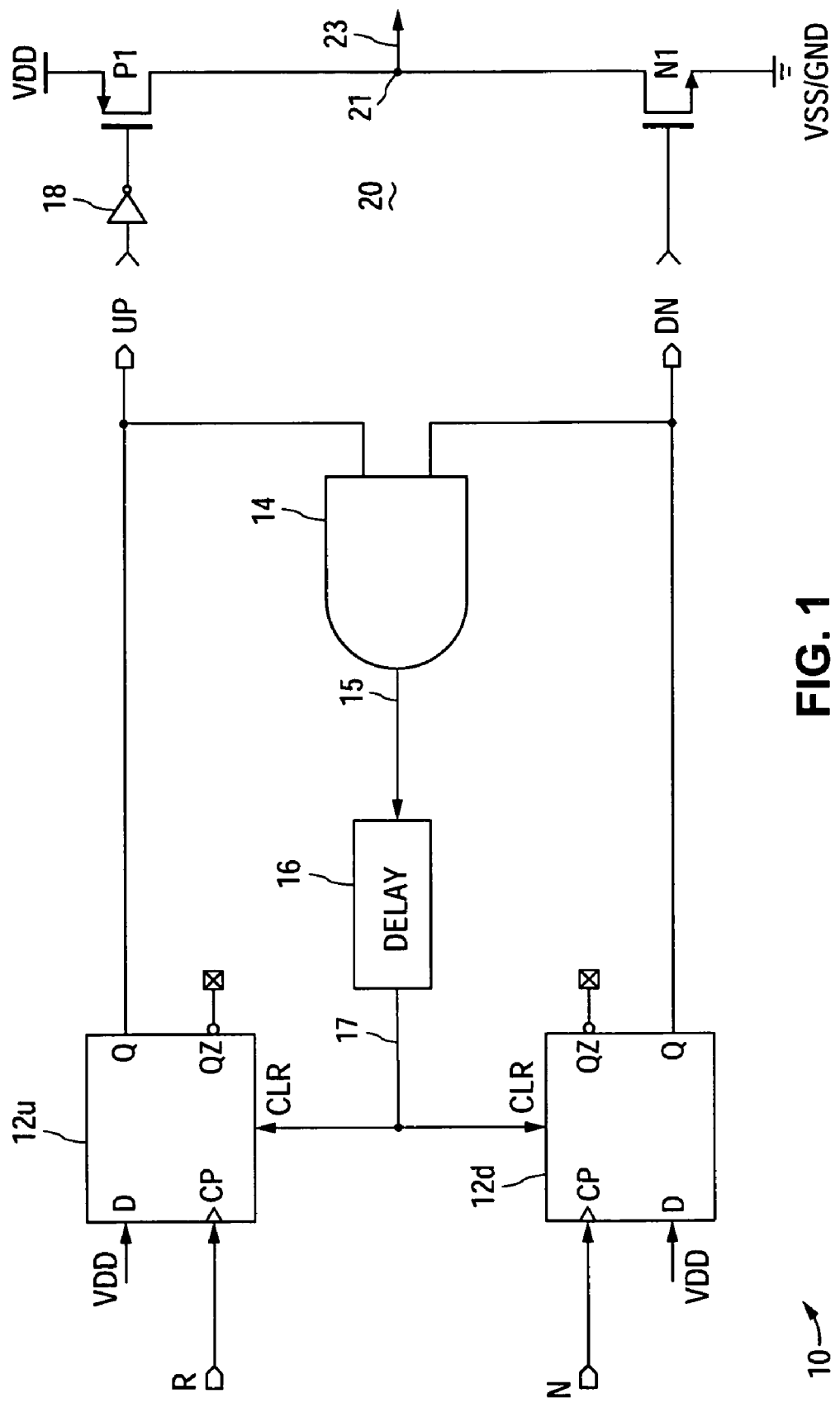
FIG. 1 is a schematic diagram of a conventional PFD circuit and associated charge pump circuit.
Figure 2:
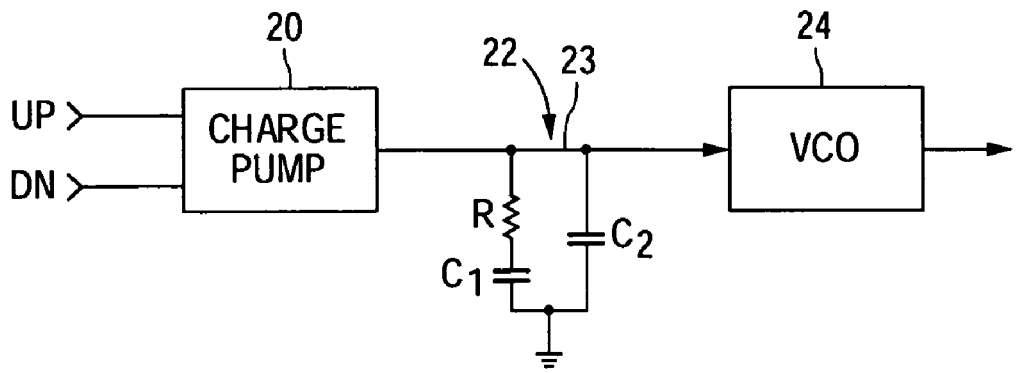
FIG. 2 is a functional block and schematic diagram of a conventional charge pump circuit, loop filter circuit and voltage-controlled oscillator as used in a PLL.
Figure 3:
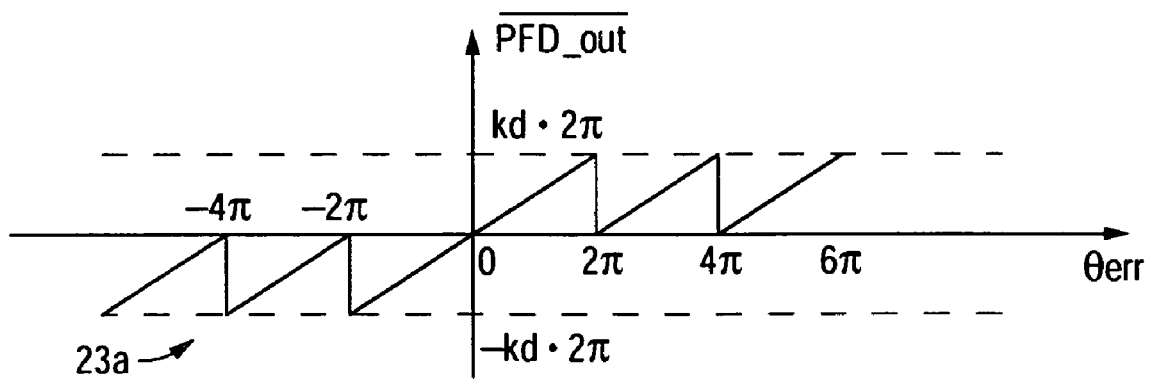
FIG. 3 is a graph of the transfer function for the circuit of FIG. 1.
Figure 4:
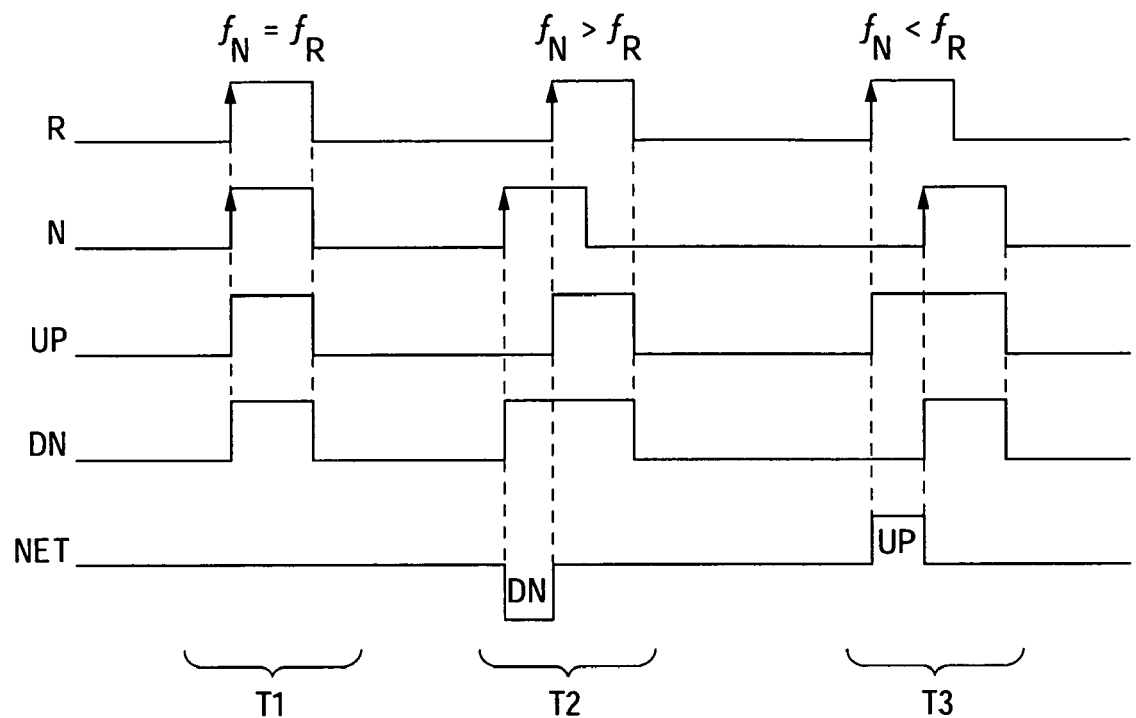
FIG. 4 is a signal timing diagram for the input and output signals of the circuit of FIG. 1.
Figure 5:
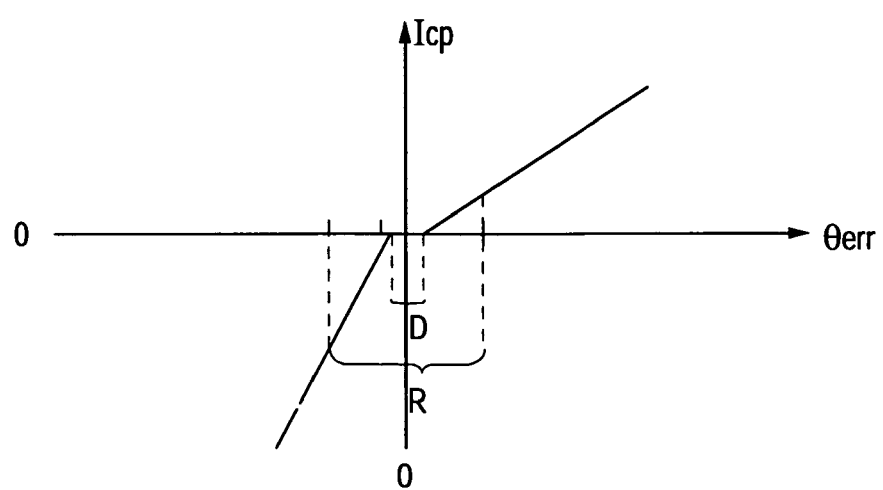
FIG. 5 is a graph of the transfer function for the circuit of FIG. 1.
Figure 6:
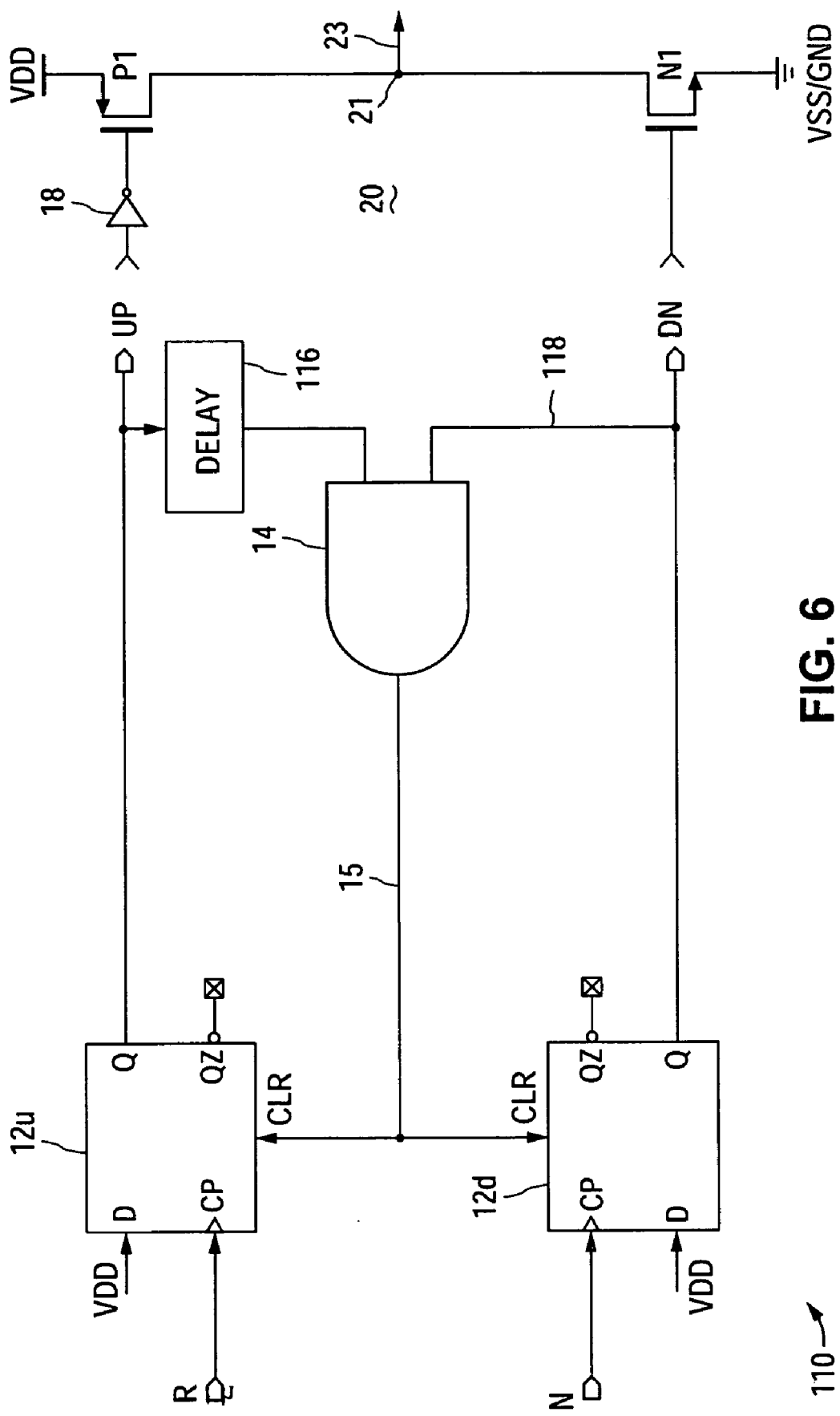
FIG. 6 is a schematic diagram of a PFD in accordance with one embodiment of the presently claimed invention.

Referring to FIG. 6, a PFD 110 in accordance with one embodiment of the presently claimed invention includes the D-type flip-flops 12u, 12d and feedback AND gate 14 of a conventional PFD 10 (FIG. 1), plus delay circuitry 116 inserted within the feedback path of one of the two output signals, in this case the pump up signal UP. (It should be understood that other forms of bi-stable circuits, including RS latches, can be used in place of D-type flip-flops.) The time delay introduced by the delay circuitry 116 should be larger than the pulse width of the signal not associated with the delayed signal. In other words, in this embodiment 110, the pump up signal UP is being delayed by the delay circuitry 116. This pump up signal UP corresponds to the reference signal R. Accordingly, the time delay introduced by the delay circuitry 116 should be greater then the pulse width of the other signal, i.e., the incoming feedback signal N (e.g., for a feedback signal N pulse width of two nanoseconds, the time delay of the delay circuitry 116 should be on the order of approximately three nanoseconds). This will ensure that the output signal being delayed, i.e., the pump up signal UP, will not change in pulse width, at least so long as the phase difference between the incoming signals R, N is within a predetermined phase difference range centered about zero phase difference, i.e., near and during phase-lock and within the useable phase difference range R.

Figure 7:
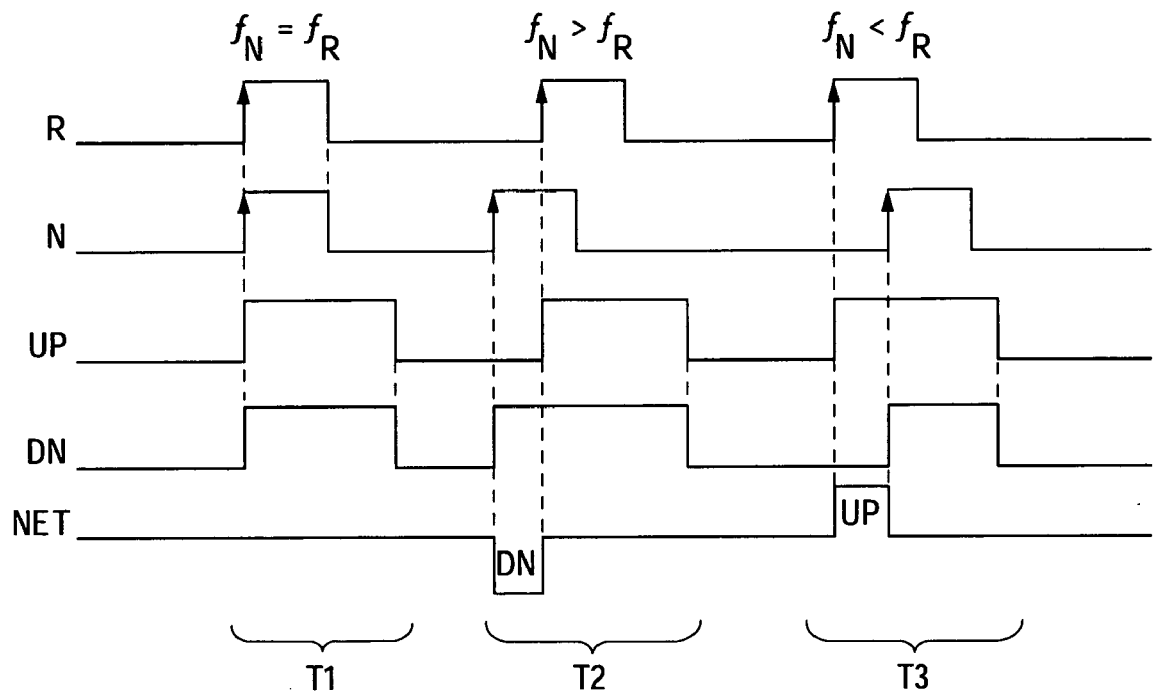
FIG. 7 is a signal timing diagram for the input and output signals of the circuit of FIG. 6.

Referring to FIG. 7, when the reference R and feedback N signal frequencies are equal (time interval T1), the reference R and feedback N signal pulses are in alignment, as are the pump up UP and pump down DN control signals. Accordingly, the net output 23 of the charge pump 20 is zero. When the feedback signal N frequency is greater than the reference signal R frequency (time interval T2), the feedback signal N pulses lead those of the reference signal R, as do those of the pump down signal DN as compared to the pump up signal UP. The net result is a sinking of current by the charge pump 20. When the feedback signal N frequency is less then the reference signal R frequency (time interval T3), the feedback signal N pulses lag those of the reference signal R, as do those of the pump down signal DN as compared to the pump up signal UP. The net result is a sourcing of current by the charge pump 20.

Figure 8:
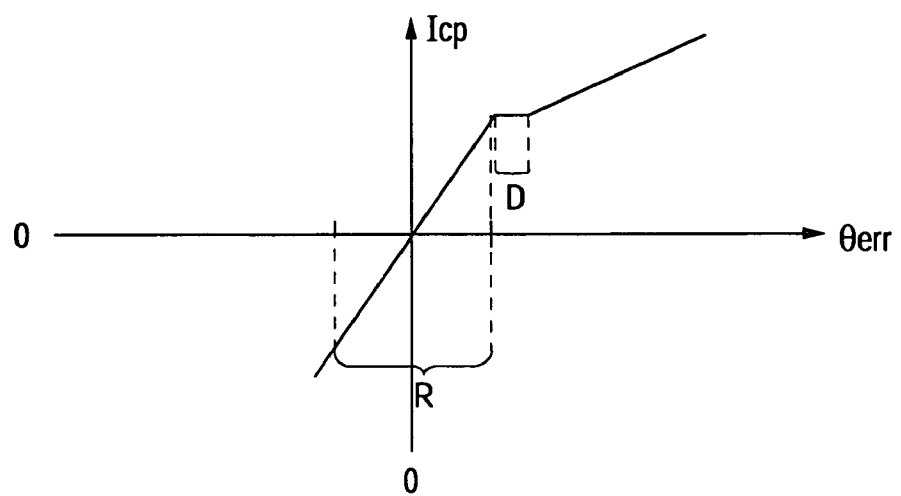
FIG. 8 is a graph of the transfer function for the circuit of FIG. 6.

Referring to FIG. 8, by maintaining a constant pump up signal UP pulse width, the PFD dead zone D can be pushed outside the useable operating range R, thereby maintaining a substantially linear phase error gain within that range R centered about zero phase error. With such substantially linear phase error gain being maintained within the useable operating range R, any mismatches between the pump up and pump down currents provided by the charge pump 20 to the output terminal 21 (FIG. 1) will pose little if any risk of causing mixing of high energy, high frequency spurious offset signals down to lower frequencies where the loop filter can no longer adequately suppress them. It should be understood that while the foregoing discussion has been in terms of introducing an asymmetrical delay for the pump up signal UP, an alternative implementation would place the delay circuitry 116 in the feedback path to the AND gate 14 for the pump down signal DN, thereby delaying the pump down signal DN relative to the pump up signal UP. In any event, what is important for purposes of the presently claimed invention is that the relative delays between the two input signals to the AND gate 14 are sufficiently different, i.e., asymmetrical. Hence, with reference to the circuitry of FIG. 6, while the feedback signal path 118 for the pump down signal DN will have some small finite amount of delay, albeit very small, the delay introduced by the delay circuitry 116 will be substantially larger by comparison.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a phase-frequency detector (PFD) having substantially linear phase error gain within a predetermined phase error range centered about zero phase error when used in a delta sigma phase-locked loop (PLL), comprising:
   first logic circuitry that receives reference, feedback and output control signals and in response thereto provides frequency increase and decrease control signals, wherein
      said reference signal has an associated frequency, phase and assertion state,
      said feedback signal has an associated frequency, phase and assertion state,
      said frequency increase control signal is indicative of when said feedback signal frequency is lower than said reference signal frequency, has an assertion state corresponding to said reference signal assertion state and has a de-assertion state responsive to said output control signal, and
      said frequency decrease control signal is indicative of when said feedback signal frequency is higher than said reference signal frequency, has an assertion state corresponding to said feedback signal assertion state and has a de-assertion state responsive to said output control signal; and
   second logic circuitry, coupled to said first logic circuitry, that receives and combines said frequency increase and decrease control signals and in response thereto provides said output control signal, wherein one of said frequency increase and decrease control signal assertion states is of a substantially constant time duration at least during when a difference between said reference and feedback signal phases is within a predetermined phase difference range centered about zero phase difference.

2. The apparatus of claim 1, wherein said first logic circuitry comprises:
   first flip-flop circuitry that receives said reference and output control signals and in response thereto provides said frequency increase control signal; and
   second flip-flop circuitry that receives said feedback and output control signals and in response thereto provides said frequency decrease control signal.

3. The apparatus of claim 1, wherein said first logic circuitry comprises:
   first latch circuitry that receives said reference and output control signals and in response thereto provides said frequency increase control signal; and
   second latch circuitry that receives said feedback and output control signals and in response thereto provides said frequency decrease control signal.

4. The apparatus of claim 1, wherein said second logic circuitry comprises:
   a first signal path that conveys said frequency increase control signal with a first associated signal delay;
   a second signal path that conveys said frequency decrease control signal with a second associated signal delay substantially unequal to said first associated signal delay; and
   combinational logic circuitry, coupled to said first and second signal paths, that receives and combines said conveyed frequency increase and decrease control signals and in response thereto provides said output control signal.

5. The apparatus of claim 1, wherein said second logic circuitry comprises:
   delay circuitry, coupled to said first logic circuitry, that receives and conveys said frequency increase control signal with an associated signal delay; and
   combinational logic circuitry, coupled to said delay circuitry and said first logic circuitry, that receives and combines said delayed frequency increase control signal and said frequency decrease control signal and in response thereto provides said output control signal.

6. The apparatus of claim 5, wherein said combinational logic circuitry comprises a logic AND gate.

7. An apparatus including a phase-frequency detector (PFD) having substantially linear phase error gain within a predetermined phase error range centered about zero phase error when used in a delta sigma phase-locked loop (PLL), comprising:
   first logic circuitry that receives a reference signal and an output control signal and in response thereto provides a frequency increase control signal and a corresponding delayed frequency increase control signal;
   second logic circuitry that receives a feedback signal and said output control signal and in response thereto provides a frequency decrease control signal and a corresponding delayed frequency decrease control signal; and
   third logic circuitry, coupled to said first logic circuitry and said second logic circuitry, that receives and combines said delayed frequency increase and decrease control signals and in response thereto provides said output control signal;
   wherein said reference signal has an associated frequency, phase and assertion state, said feedback signal has an associated frequency, phase and assertion state, said frequency increase control signal is indicative of when said feedback signal frequency is lower than said reference signal frequency, has an assertion state corresponding to said reference signal assertion state and has a de-assertion state responsive to said output control signal, said frequency decrease control signal is indicative of when said feedback signal frequency is higher than said reference signal frequency, has an assertion state corresponding to said feedback signal assertion state and has a de-assertion state responsive to said output control signal, said delayed frequency increase and decrease control signals are delayed by substantially unequal time intervals, and one of said frequency increase and decrease control signal assertion states is of a substantially constant time duration at least during when a difference between said reference and feedback signal phases is within a predetermined phase difference range centered about zero phase difference.

8. The apparatus of claim 7, wherein:

said first logic circuitry comprises
   first flip-flop circuitry that receives said reference and output control signals and in response thereto provides said frequency increase control signal, and
   delay circuitry, coupled to said first flip-flop circuitry, that receives and conveys said frequency increase control signal with an associated signal delay and provides said delayed frequency increase control signal; and said second logic circuitry comprises second flip-flop circuitry that receives said feedback and output control signals and in response thereto provides said frequency decrease control signal and said delayed frequency decrease control signal.

9. The apparatus of claim 7, wherein:

said first logic circuitry comprises
   first latch circuitry that receives said reference and output control signals and in response thereto provides said frequency increase control signal, and
   delay circuitry, coupled to said first flip-flop circuitry, that receives and conveys said frequency increase control signal with an associated signal delay and provides said delayed frequency increase control signal; and said second logic circuitry comprises second latch circuitry that receives said feedback and output control signals and in response thereto provides said frequency decrease control signal and said delayed frequency decrease control signal.

10. The apparatus of claim 7, wherein said third logic circuitry comprises a logic AND gate.

11. An apparatus including a phase-frequency detector (PFD) having substantially linear phase error gain within a predetermined phase error range centered about zero phase error when used in a delta sigma phase-locked loop (PLL), comprising:

first logic means for receiving reference, feedback and output control signals and in response thereto providing frequency increase and decrease control signals, wherein said reference signal has an associated frequency, phase and assertion state, said feedback signal has an associated frequency, phase and assertion state, said frequency increase control signal is indicative of when said feedback signal frequency is lower than said reference signal frequency, has an assertion state corresponding to said reference signal assertion state and has a de-assertion state responsive to said output control signal, and said frequency decrease control signal is indicative of when said feedback signal frequency is higher than said reference signal frequency, has an assertion state corresponding to said feedback signal assertion state and has a de-assertion state responsive to said output control signal; and second logic means for combining said frequency increase and decrease control signals and in response thereto providing said output control signal, wherein one of said frequency increase and decrease control signal assertion states is of a substantially constant time duration at least during when a difference between said reference and feedback signal phases is within a predetermined phase difference range centered about zero phase difference.

12. The apparatus of claim 11, wherein said second logic means comprises:

first signal conveyance means for conveying said frequency increase control signal with a first associated signal delay;

second signal conveyance means for conveying said frequency decrease control signal with a second associated signal delay substantially unequal to said first associated signal delay; and third logic means for combining said conveyed frequency increase and decrease control signals and in response thereto providing said output control signal.

13. The apparatus of claim 11, wherein said second logic means comprises:

delay means for conveying said frequency increase control signal with an associated signal delay; and third logic means for combining said delayed frequency increase control signal and said frequency decrease control signal and in response thereto providing said output control signal.

14. An apparatus including a phase-frequency detector (PFD) having substantially linear phase error gain within a predetermined phase error range centered about zero phase error when used in a delta sigma phase-locked loop (PLL), comprising:

first logic means for receiving a reference signal and an output control signal and in response thereto providing a frequency increase control signal and a corresponding delayed frequency increase control signal;

second logic means for receiving a feedback signal and said output control signal and in response thereto providing a frequency decrease control signal and a corresponding delayed frequency decrease control signal; and third logic means for combining said delayed frequency increase and decrease control signals and in response thereto providing said output control signal;

wherein said reference signal has an associated frequency, phase and assertion state, said feedback signal has an associated frequency, phase and assertion state, said frequency increase control signal is indicative of when said feedback signal frequency is lower than said reference signal frequency, has an assertion state corresponding to said reference signal assertion state and has a de-assertion state responsive to said output control signal, said frequency decrease control signal is indicative of when said feedback signal frequency is higher than said reference signal frequency, has an assertion state corresponding to said feedback signal assertion state and has a de-assertion state responsive to said output control signal, said delayed frequency increase and decrease control signals are delayed by substantially unequal time intervals, and one of said frequency increase and decrease control signal assertion states is of a substantially constant time duration at least during when a difference between said reference and feedback signal phases is within a predetermined phase difference range centered about zero phase difference.

* * * * *